(12) United States Patent
Sowwan et al.

(10) Patent No.: US 12,094,726 B2
(45) Date of Patent: Sep. 17, 2024

(54) ADAPTING ELECTRICAL, MECHANICAL, AND THERMAL PROPERTIES OF PACKAGE SUBSTRATES

(71) Applicant: Applied Materials, Inc., Santa Clara, CA (US)

(72) Inventors: Mukhles Sowwan, Sunnyvale, CA (US); Samer Banna, San Jose, CA (US); Nirmalya Maity, Los Altos, CA (US); Omkaram Nalamasu, San Jose, CA (US); Gary E. Dickerson, Gloucester, MA (US)

(73) Assignee: Applied Materials, Inc., Santa Clara, CA (US)

( * ) Notice: Subject to any disclaimer, the term of this patent is extended or adjusted under 35 U.S.C. 154(b) by 423 days.

(21) Appl. No.: 17/549,325

(22) Filed: Dec. 13, 2021

(65) Prior Publication Data

US 2023/0187222 A1    Jun. 15, 2023

(51) Int. Cl.
*H01L 21/48* (2006.01)
*H01L 23/14* (2006.01)
*H01L 23/498* (2006.01)

(52) U.S. Cl.
CPC ........ *H01L 21/486* (2013.01); *H01L 21/4857* (2013.01); *H01L 23/147* (2013.01); *H01L 23/49822* (2013.01)

(58) Field of Classification Search
CPC ............. H01L 23/498; H01L 23/49822; H01L 21/4857; H01L 21/4846; H01L 23/49894; H01L 21/76825
See application file for complete search history.

(56) References Cited

U.S. PATENT DOCUMENTS 6,569,781 B1    5/2003  Dokumaci et al.
10,128,197 B2  11/2018  Ranish et al.
(Continued)

FOREIGN PATENT DOCUMENTS

WO    WO-2020029657 A1 *  2/2020  ......... H01L 25/0753

OTHER PUBLICATIONS

International Search Report/ Written Opinion issued to PCT/US2022/048791 on Mar. 16, 2023.
(Continued)

*Primary Examiner* — Zandra V Smith
*Assistant Examiner* — Evan G Clinton
(74) *Attorney, Agent, or Firm* — Patterson & Sheridan LLP.

(57) ABSTRACT

The present disclosure relates to semiconductor core assemblies and methods of forming the same. The semiconductor core assemblies described herein may be utilized to form semiconductor package assemblies, printed circuit board (PCB) assemblies, PCB spacer assemblies, chip carrier assemblies, intermediate carrier assemblies (e.g., for graphics cards), and the like. In one embodiment, a substrate core (e.g., a core structure) is implanted with dopants to achieve a desired bulk resistivity or conductivity. One or more conductive interconnections are formed in the substrate core and one or more redistribution layers are formed on surfaces thereof. The substrate core may thereafter be utilized as a core structure for a semiconductor package, PCB, PCB spacer, chip carrier, intermediate carrier, or the like.

19 Claims, 7 Drawing Sheets

(56) References Cited

U.S. PATENT DOCUMENTS

| | | | |
|---|---|---|---|
| 10,886,232 | B2 | 1/2021 | Chen et al. |
| 10,937,726 | B1 | 3/2021 | Chen et al. |
| 11,063,169 | B2 | 7/2021 | Chen et al. |
| 2010/0022066 | A1 | 1/2010 | Aoki et al. |
| 2012/0192413 | A1 | 8/2012 | Ma et al. |
| 2012/0261805 | A1 | 10/2012 | Sundaram et al. |
| 2017/0178908 | A1 | 6/2017 | Hatem et al. |
| 2018/0138080 | A1* | 5/2018 | Usenko .............. H01L 21/76254 |
| 2020/0358163 | A1* | 11/2020 | See ........................ H01L 21/486 |
| 2020/0395304 | A1 | 12/2020 | Chen et al. |
| 2021/0003926 | A1* | 1/2021 | Gonchar .............. G02B 5/0808 |
| 2021/0159158 | A1 | 5/2021 | Chen et al. |
| 2021/0257307 | A1 | 8/2021 | Chen et al. |

OTHER PUBLICATIONS

Q.Chen (2015). Modeling, design and demonstration of through package vias in panel-based polycrystalline silicon interposer for high performance, high reliability and low cost [ doctoral dissertation]. Georgia Institute of Technology.

V.Sundaram (2009). Advances in electronic packaging technologies by ultra-small microvias, super fine interconnections and low loss polymer dielectrics [doctoral dissertation]. Georgia Institute of Technology.

P. A. Thadesar, X. Gu, R. Alapati and M. S. Bakir, "Through-Silicon Vias: Drivers, Performance, and Innovations," in IEEE Transactions on Components, Packaging and Manufacturing Technology, vol. 6, No. 7, pp. 1007-1017, Jul. 2016, doi: 10.1109/TCPMT.2016. 2524691.

N. Z. Hashim and C. H. de Groot, "Gold-compensated high resistivity silicon as low-loss microwave substrate," 2018 Australian Microwave Symposium (AMS), 2018, pp. 37-38, doi: 10.1109/ AUSMS.2018.8346970.

Z. I. Hashim, A. Abuelgasim and C. H. de Groot, "Coplanar waveguides on gold-doped high resistivity silicon for 67-GHz microwave application," 2013 IEEE International RF and Microwave Conference (RFM), 2013, pp. 274-277, doi: 10.1109/RFM. 2013.6757265.

Ithan A. Scott, Sean W. King, Nanette N. Jarenwattananon, William A. Lanford, Han Li, James Rhodes, and Patrick E. Hopkins. Thermal Conductivity Enhancement in Ion-Irradiated Hydrogenated Amorphous Carbon Films Nano Letters 2021 21 (9), 3935-3940.DOI: 10.1021/acs.nanolett.1c00616.

Shojaee, S., Qi, Y., Wang, Y. et al. Ion irradiation induced structural modifications and increase in elastic modulus of silica based thin films. Sci Rep 7, 40100 (2017). <https://doi.org/10.1038/ srep40100>.

* cited by examiner

ADAPTING ELECTRICAL, MECHANICAL, AND THERMAL PROPERTIES OF PACKAGE SUBSTRATES

BACKGROUND

Field

Embodiments of the present disclosure generally relate to electronic mounting structures and methods of forming the same. More specifically, embodiments described herein relate to semiconductor package and printed circuit board (PCB) assemblies and methods of forming the same.

Description of the Related Art

Due to an ever-increasing demand for miniaturized electronic devices and components, integrated circuits have evolved into complex 2.5D and 3D devices that can include millions of transistors, capacitors, and resistors on a single chip. The evolution of chip design has resulted in greater circuit density to improve the process capability and speed of integrated circuits. The demand for faster processing capabilities with greater circuit densities imposes corresponding demands on the materials, structures, and processes used in the fabrication of such integrated circuit chips. Alongside these trends toward greater integration and performance, however, there exists the constant pursuit for reduced manufacturing costs.

Conventionally, integrated circuit chips have been fabricated on organic package substrates due to the ease of forming features and connections therethrough, as well as the relatively low package manufacturing costs associated with organic composites. However, as circuit densities are increased and electronic devices are further miniaturized, the utilization of organic package substrates becomes impractical due to limitations with material structuring resolution to sustain device scaling and associated performance requirements. In particular, organic package substrates are limited by their bulk resistivity and conductivity, both of which affect an insertion loss of the package substrate.

Therefore, what is needed in the art are improved semiconductor package and printed circuit board (PCB) core assemblies having increased bulk resistivities or thermal conductivities and methods of forming the same.

SUMMARY

Embodiments of the present disclosure generally relate to electronic mounting structures and methods of forming the same. More specifically, embodiments described herein relate to semiconductor package and printed circuit board (PCB) assemblies and methods of forming the same.

In one embodiment, a method of forming a semiconductor device package is provided. The method generally includes exposing a first side of a core structure to an implantation process to achieve a first bulk resistivity across a surface of the first side of the core structure. The core structure comprises silicon, the implantation process comprises implanting dopants into the surface of the first side, and the dopants are selected from a group comprising gold (Au), silver (Ag), palladium (Pd), manganese (Mn), hydrogen (H), arsenic (As), nitrogen (N), and oxygen (O). The method also includes annealing the core structure after performing the implantation process. The method also includes forming a plurality of holes in the core structure. The plurality of holes extend from the first side to a second side of the core structure opposite the first side, and are positioned to allow formation of one or more conductive interconnections within the semiconductor device package between the first side and the second side. The method also includes embedding the core structure in a dielectric material.

In another embodiment, a method of forming a semiconductor device package is provided. The method generally includes exposing a first side of a core structure to an implantation process to achieve a first bulk conductivity across a surface of the first side of the core structure. The core structure comprises silicon, the implantation process comprises implanting dopants into the surface of the first side, the dopants are selected from a group comprising gold (Au), silver (Ag), palladium (Pd), manganese (Mn), hydrogen (H), arsenic (As), nitrogen (N), and oxygen (O). The method also includes annealing the core structure after performing the implantation process. The method also includes forming a plurality of holes in the core structure. The plurality of holes extend from the first side to a second side of the core structure opposite the first side, and are positioned to allow formation of one or more conductive interconnections within the semiconductor device package between the first side and the second side. The method also includes embedding the core structure in a dielectric material.

In another embodiment, a method of forming a semiconductor device assembly is provided. The method generally includes forming an oxide layer over a core structure. The core structure has a thickness less than about 100 μm. The method also includes implanting dopants into the core structure to achieve a desired bulk resistivity or a desired bulk conductivity. The method also includes annealing the core structure. The method also includes forming a plurality of holes and at least one cavity in the core structure. The plurality of holes extend from a first side of the core structure to a second side of the core structure. The method also includes removing the oxide layer from the core structure via a damage removal process. The method also includes disposing a die in the at least one cavity. The die comprises at least one contact. The method also includes forming an insulating layer around the core structure. The method also includes forming at least one contact hole in the insulating layer and the core structure. The at least one contact hole exposes the at least one contact. The method also includes forming a first redistribution layer on the first side of the core structure. The first redistribution layer comprises redistribution connections to electrically couple the at least one contact of the die to a major surface of the semiconductor device assembly. The method also includes forming a second redistribution layer on the second side of the core structure, wherein the first redistribution layer and the second redistribution layer each have one or more conductive contacts formed thereon.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of the scope of the disclosure, as the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

In the following description, numerous specific details are set forth to provide a more thorough understanding of the present disclosure. However, it will be apparent to one of skill in the art that some embodiments of the present disclosure may be practiced without one or more of these specific details. In other instances, well-known features have not been described in order to avoid obscuring one or more embodiments of the present disclosure.

The present disclosure relates to semiconductor core assemblies and methods of forming the same. The semiconductor core assemblies described herein may be utilized to form semiconductor device package assemblies, printed circuit board (PCB) assemblies, PCB spacer assemblies, chip carrier assemblies, intermediate carrier assemblies (e.g., for graphics cards), and the like. In one embodiment, a substrate core (e.g., a core structure) is implanted with dopants to achieve a desired bulk resistivity or conductivity. One or more conductive interconnections are formed in the substrate core and one or more redistribution layers are formed on surfaces thereof. The substrate core may thereafter be utilized as a core structure for a semiconductor package, PCB, PCB spacer, chip carrier, intermediate carrier, or the like.

The methods and apparatus disclosed herein include novel high bulk resistivity and high bulk conductivity semiconductor core structures intended to replace more conventional semiconductor package, PCB, and chip carrier structures. Generally, several properties are desired in semiconductor core structures. A low coefficient of thermal expansion may match that of mating components, such as dies, which may be made of silicon. A high temperature stability may be needed to withstand substrate package related fabrication and assembly processes. A high elastic modulus may help minimize warpage during formation of redistribution layers on the core structures. A high bulk resistivity may improve signal isolation and minimize losses and crosstalk. Good bulk thermal conductivity may result in effective heat dissipation. Meeting several or all of these requirements is challenging, particularly when using large area core structures, such as core structures between 300 mm to 600 mm in diameter, while maintaining a low-cost processing capability.

The methods disclosed herein may provide semiconductor core structures that overcome many of the disadvantages associated with conventional semiconductor package, PCB, spacer, and carrier structures described above.

Figure 1:
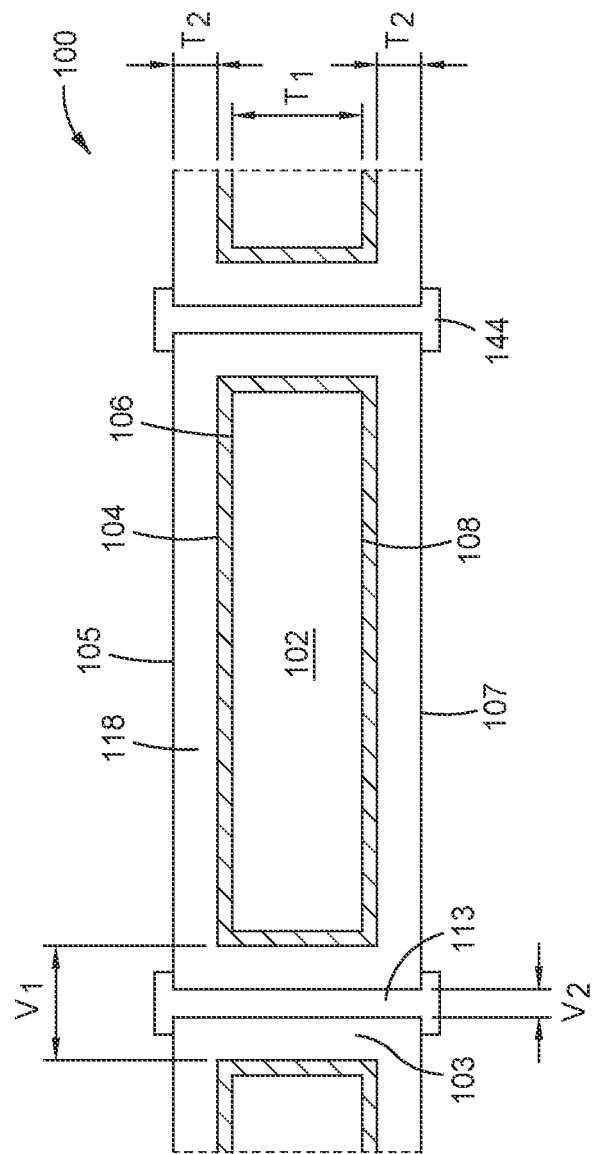
FIG. 1 schematically illustrates a cross-sectional view of a semiconductor core assembly, according to an embodiment described herein.

FIG. 1 schematically illustrates a cross-sectional view of a semiconductor core assembly 100, according to an embodiment described herein. The semiconductor core assembly 100 has a first major surface 105 and a second major surface 107, and may be utilized for structural support and electrical interconnection of semiconductor device packages mounted thereon. In further examples, the semiconductor core assembly 100 may be utilized as a carrier structure for a surface-mounted device, such as a chip or graphics card. The semiconductor core assembly 100 generally includes a core structure 102, an optional passivating layer 104, and an insulating layer 118.

In the depicted embodiment, the core structure 102 comprises silicon. In some embodiments, the core structure 102 includes a substrate formed of any suitable substrate material. For example, the core structure 102 includes a substrate formed from a III-V compound semiconductor material, silicon, crystalline silicon (e.g., Si<100> or Si<111>), silicon oxide, silicon germanium, polysilicon, silicon nitride, quartz, glass (e.g., borosilicate glass), sapphire, alumina, and/or ceramic materials. In some embodiments, the core structure 102 includes a monocrystalline p-type or n-type silicon substrate. In some embodiments, the core structure 102 includes a polycrystalline p-type or n-type silicon substrate. In some embodiments, the core structure 102 includes a p-type or an n-type silicon solar substrate.

The substrate utilized to form the core structure 102 may further have a polygonal or circular shape. For example, the core structure 102 may include a substantially square silicon substrate having lateral dimensions between about 120 mm and about 180 mm, with or without chamfered edges. In another example, the core structure 102 may include a circular silicon-containing wafer having a diameter between about 20 mm and about 700 mm, such as between about 50 mm and about 600 mm, for example about 300 mm.

The core structure 102 has a thickness $T_1$ between about 50 μm and about 1000 μm, such as a thickness $T_1$ between about 70 μm and about 800 μm. For example, the core structure 102 has a thickness $T_1$ between about 80 μm and about 400 μm, such as a thickness $T_1$ between about 100 μm and about 200 μm. In another example, the core structure 102 has a thickness $T_1$ between about 70 μm and about 150 μm, such as a thickness $T_1$ between about 100 μm and about 130 μm. In another embodiment, the substrate has a thickness $T_1$ between about 50 μm and 100 μm, such as about 50 μm or about 100 μm.

The core structure 102 further includes one or more holes or core vias 103 (hereinafter referred to as "core vias") formed therein and positioned to enable conductive electrical interconnections to be routed through the core structure 102. Generally, the one or more core vias 103 are substantially cylindrical in shape. However, other suitable morphologies for the core vias 103 are also contemplated. The core vias 103 may be formed as singular and isolated core vias 103 through the core structure 102 or in one or more groupings or arrays. In some embodiments, the one or more core vias 103 have a diameter $V_1$ less than about 500 μm, such as a diameter $V_1$ less than about 250 μm. For example, the core vias 103 have a diameter $V_1$ between about 25 μm and about 100 μm, such as a diameter $V_1$ between about 30 μm and about 60 μm. In some embodiments, the core vias 103 have a diameter $V_1$ of about 40 μm.

The passivating layer 104 may be formed on one or more surfaces of the core structure 102, including a surface of a first side 106, a surface of a second side 108, and one or more sidewalls of the core vias 103. In the depicted embodiment, the second side 108 is opposite to the first side 106. In some embodiments, the passivating layer 104 is formed on substantially all exterior surfaces of the core structure 102 such that the passivating layer 104 substantially surrounds the core structure 102. Thus, the passivating layer 104 provides a protective outer barrier for the core structure 102 against corrosion and other forms of damage. In one embodiment, the passivating layer 104 is formed of an oxide film or layer, such as a thermal oxide layer. The core structure 102 may be exposed to an oxidation process to grow the oxide film on desired surfaces thereof after removal of mechanical defects from the one or more surfaces of the core structure 102.

In some embodiments, the core structure 102 is exposed to a thermal oxidation process to grow the passivating layer 104 thereon. The thermal oxidation process is performed at a temperature between about 800° C. and about 1200° C., such as between about 850° C. and about 1150° C. For example, the thermal oxidation process is performed at a temperature between about 900° C. and about 1100° C., such as a temperature between about 950° C. and about 1050° C. In some embodiments, the thermal oxidation process is a wet oxidation process utilizing water vapor as an oxidant. In some embodiments, the thermal oxidation process is a dry oxidation process utilizing molecular oxygen as the oxidant. It is contemplated that the core structure 102 may be exposed to any suitable passivation process to form the passivating layer 104 or any other suitable passivating layer thereon. In some embodiments, the passivating layer 104 is a silicon dioxide film. In some examples, the passivating layer 104 has a thickness between about 100 nm and about 3 μm, such as a thickness between about 200 nm and about 2.5 μm. In one example, the passivating layer 104 has a thickness between about 300 nm and about 2 μm, such as a thickness of about 1.5 μm.

The insulating layer 118 is formed on one or more surfaces of the core structure 102 or the passivating layer 104 and may substantially encase the passivating layer 104 and/or the core structure 102. Thus, the insulating layer 118 may extend into the core vias 103 and coat the passivating layer 104 formed on the sidewalls thereof or directly coat the core structure 102, thus defining the diameter $V_2$ as depicted in FIG. 1. In one embodiment, the insulating layer 118 has a thickness $T_2$ from an outer surface of the core structure 102 or the passivating layer 104 to an adjacent outer surface of the insulating layer 118 (e.g., the major surfaces 105 and 107) that is less than about 50 μm, such as a thickness $T_2$ less than about 20 μm. For example, the insulating layer 118 has thickness $T_2$ between about 5 μm and about 10 μm.

In some embodiments, the insulating layer 118 is formed of polymer-based dielectric materials such that the core structure 102 is embedded in the dielectric material. For example, the insulating layer 118 is formed from a flowable build-up material. Accordingly, although hereinafter referred to as an "insulating layer," the insulating layer 118 may also be described as a dielectric layer. In some embodiments, the insulating layer 118 is formed of an epoxy resin material having a ceramic filler, such as silica (SiO2) particles. Other examples of ceramic fillers that may be utilized to form the insulating layer 118 include aluminum nitride (AlN), aluminum oxide (Al2O3), silicon carbide (SiC), silicon nitride (Si3N4), Sr2Ce2Ti5O16, zirconium silicate (ZrSiO4), wollastonite (CaSiO3), beryllium oxide (BeO), cerium dioxide (CeO2), boron nitride (BN), calcium copper titanium oxide (CaCu3Ti4O12), magnesium oxide (MgO), titanium dioxide (TiO2), zinc oxide (ZnO) and the like. In some examples, the ceramic fillers utilized to form the insulating layer 118 have particles ranging in size between about 40 nm and about 1.5 μm, such as between about 80 nm and about 1 μm. For example, the ceramic fillers have particles ranging in size between about 200 nm and about 800 nm, such as between about 300 nm and about 600 nm. In some embodiments, the ceramic fillers include particles having a size less than about 10% of the width or diameter of adjacent core vias 103 in the core structure 102, such as a size less than about 5% of the width or diameter of the core vias 103.

One or more through-assembly holes or vias 113 (hereinafter referred to as "through-assembly vias") are formed through the insulating layer 118 where the insulating layer 118 extends into the core vias 103. For example, the through-assembly vias 113 may be centrally formed within the core vias 103 having the insulating layer 118 disposed therein. Accordingly, the insulating layer 118 forms one or more sidewalls of the through-assembly vias 113, wherein the through-assembly vias 113 have a diameter $V_2$ lesser than the diameter $V_1$ of the core vias 103. In one embodiment, the through-assembly vias 113 have a diameter $V_2$ less than about 100 μm, such as less than about 75 μm. For example, the through-assembly vias 113 have a diameter $V_2$ less than about 50 μm, such as less than about 35 μm. In one embodiment, the through-assembly vias 113 have a diameter of between about 25 μm and about 50 μm, such as a diameter of between about 35 μm and about 40 μm.

The through-assembly vias 113 provide channels through which one or more electrical interconnections 144 are formed in the semiconductor core assembly 100. In one embodiment, the electrical interconnections 144 are formed through the entire thickness of the semiconductor core assembly 100 (i.e., from the first major surface 105 to the second major surface 107 of the semiconductor core assembly 100). For example, the electrical interconnections 144 may have a longitudinal length corresponding to a total thickness of the semiconductor core assembly 100 between about 50 μm and about 1000 μm, such as a longitudinal length between about 200 μm and about 800 μm. In one example, the electrical interconnections 144 have a longitudinal length of between about 400 μm and about 600 μm, such as longitudinal length of about 500 μm. In another embodiment, the electrical interconnections 144 are only formed through a portion of the thickness of the semiconductor core assembly 100. In further embodiments, the electrical interconnections 144 may protrude from a major surface of the semiconductor core assembly 100, such as at least one of the major surfaces 105 and 107. The electrical interconnections 144 may be formed of any conductive materials used in the field of integrated circuits, circuit boards, chip carriers, and the like. For example, the electrical interconnections 144 are formed of a metallic material, such as copper (Cu), aluminum (Al), gold (Au), nickel (Ni), silver (Ag), palladium (Pd), tin (Sn), or the like. In some embodiments, the semiconductor core assembly 100 may be used in a semiconductor device assembly as part of an integrated circuit chip.

Figure 2A:
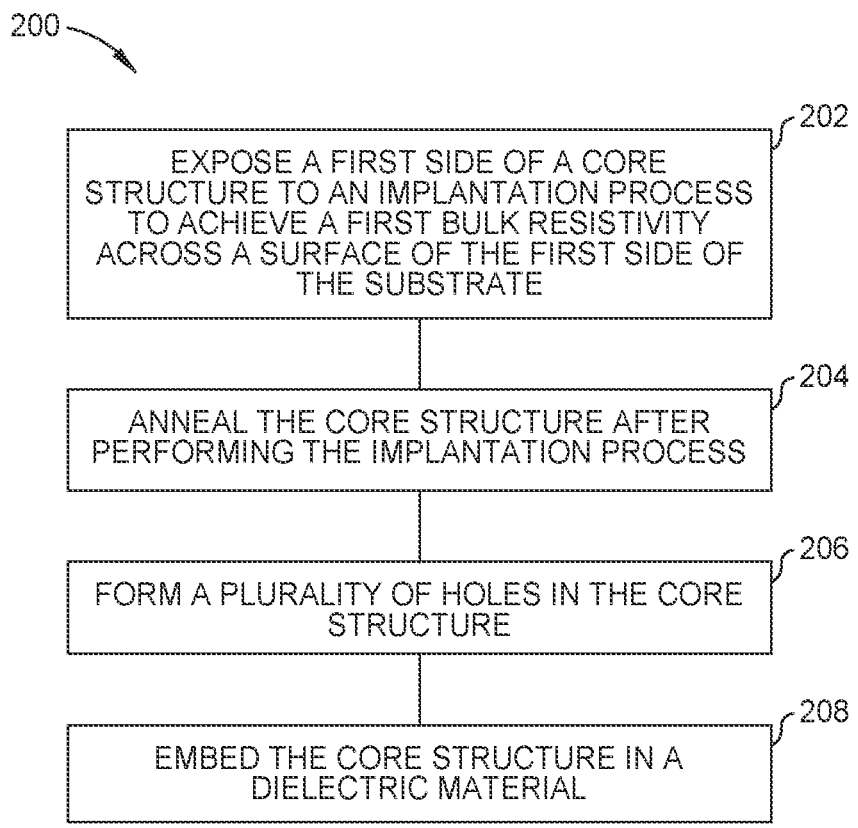
FIGS. 2A-2C are flow diagrams that illustrate processes for forming the semiconductor core assemblies of FIG. 1, according to embodiments described herein.
Figure 2B:
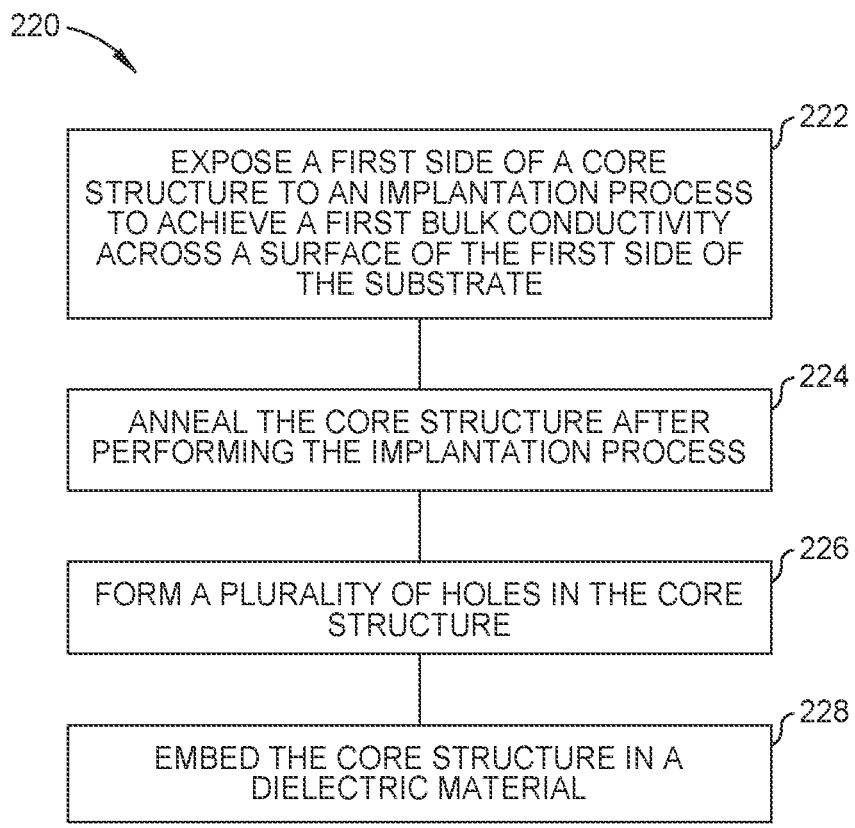
Figure 2C:
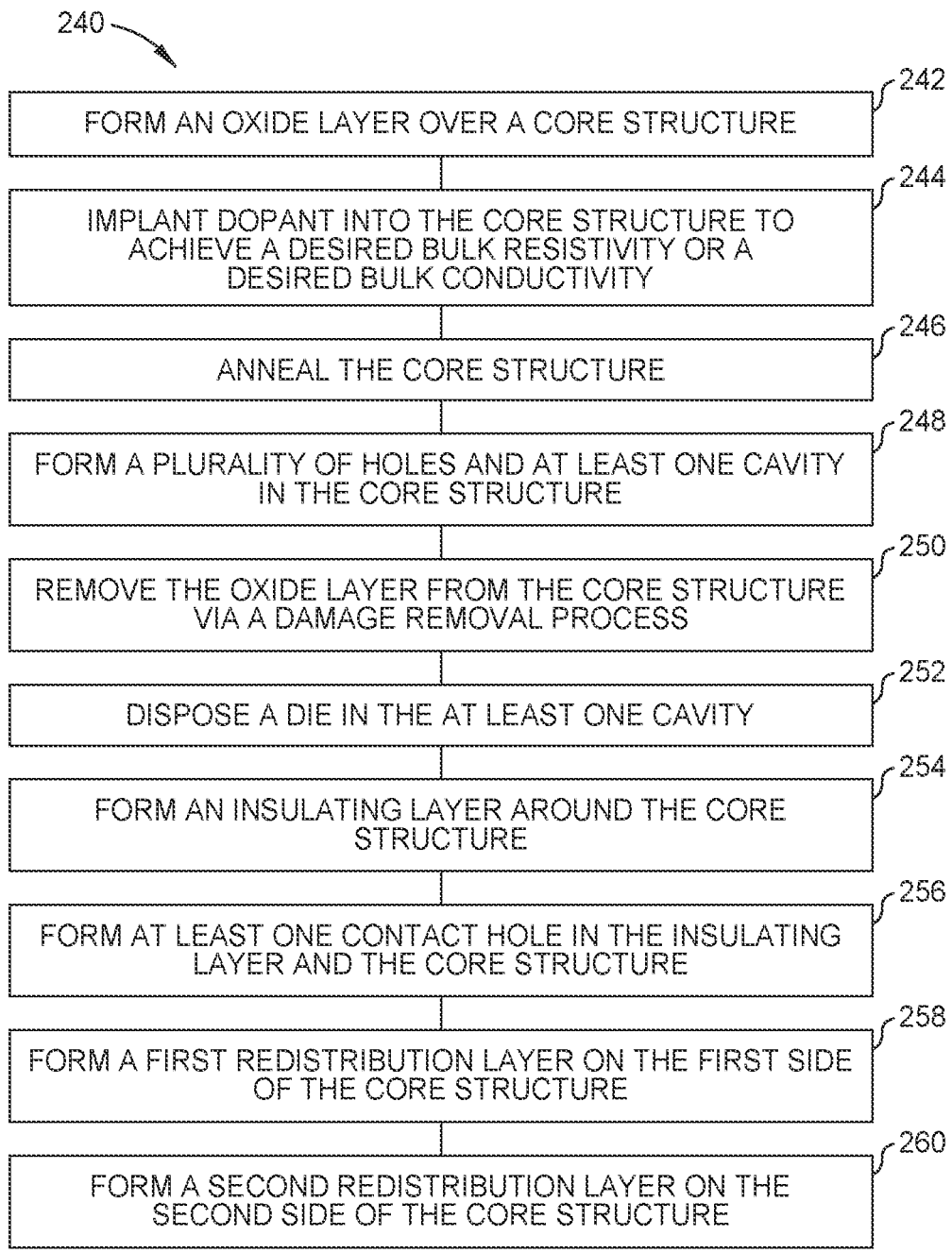

FIGS. 2A-2C are flow diagrams that illustrate processes 200, 220, and 240, respectively, for forming the semiconductor core assemblies of FIG. 1, according to embodiments described herein. FIGS. 3A-3F schematically illustrate cross-sectional views of the core structure 102 at different stages of the processes 200, 220, and 240 depicted in FIGS. 2A-2C, according to an embodiment described herein. Therefore, FIGS. 2A-2C and FIGS. 3A-3F are herein described together for clarity.

Figure 3A:
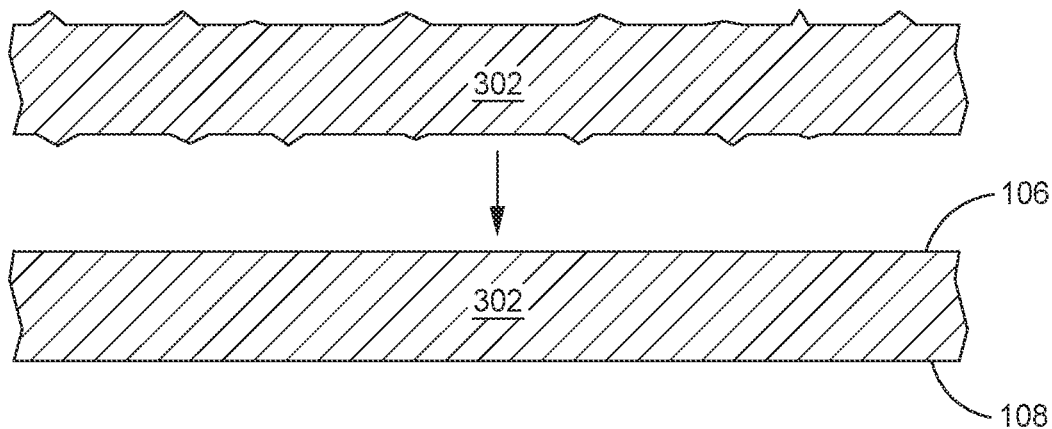
FIGS. 3A-3F schematically illustrate cross-sectional views of a core structure at different stages of the processes depicted in FIGS. 2A-2C, according to an embodiment described herein.

As shown in the embodiment in FIG. 3A, the core structure 102 may be created from a substrate 302, which may be sliced and separated from a bulk material by wire sawing, scribing and breaking, mechanical abrasive sawing, or laser cutting. The substrate 302 may be created prior to processes 200, 220, and 240 (FIGS. 2A-2C, respectively). Slicing typically causes mechanical defects or deformities in substrate surfaces formed therefrom, such as scratches, micro-cracking, chipping, and other mechanical defects. Thus, the core structure 102 is exposed to a first damage removal process to smoothen and planarize surfaces thereof and remove mechanical defects and clean the core structure 102 in preparation for later structuring operations. For example, the surface of the first side 106 may be exposed to the first damage removal process. In the depicted embodiment, the surface of the second side 108 is also exposed to the first damage removal process. In some embodiments, the core structure 102 may further be thinned by adjusting the process parameters of the first damage process. For example, a thickness of the core structure 102 may be decreased with increased exposure to the first damage removal process.

The first damage removal process includes exposing the core structure 102 to a substrate polishing process and/or an etch process followed by rinsing and drying processes. In some embodiments, first damage removal process includes a chemical mechanical polishing (CMP) process. In one embodiment, the etch process is a wet etch process including a buffered etch process that is selective for the removal of a desired material (e.g., contaminants and other undesirable compounds). In other embodiments, the etch process is a wet etch process utilizing an isotropic aqueous etch process. Any suitable wet etchant or combination of wet etchants may be used for the wet etch process. In one embodiment, the core structure 102 is immersed in an aqueous HF etching solution for etching. In another embodiment, the core structure 102 is immersed in an aqueous KOH etching solution for etching.

Figure 3B:
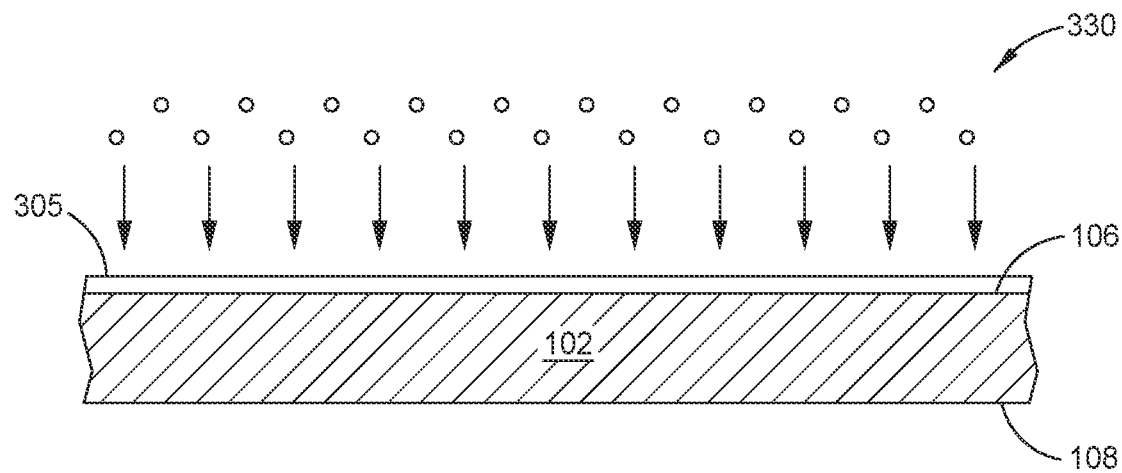

In the embodiment depicted in FIG. 3B, and in operation 202 of the process 200 in FIG. 2A and in some embodiments of the operation 244 of the process 240 in FIG. 2C, the first side 106 of the core structure 102 is exposed to an implantation process to achieve a first bulk resistivity across a surface of the first side 106 of the core structure 102. The first bulk resistivity may be at least 1 kOhm-cm, such as at least 5 kOhm-cm, such as at least 7 kOhm-cm, such as at least 10 kOhm-cm, such as at least 70 kOhm-cm. Additionally, the first bulk resistivity may be within an upper and lower limit across the surface of the first side 106, such as +/−1,000 Ohm-cm, such as +/−5,000 Ohm-cm, such as +/−10,000 Ohm-cm. Having the first bulk resistivity remain within the upper and lower limits beneficially ensures consistent performance of the core structure 102 across the surface of the first side 106.

The implantation process comprises implanting dopants 330 into the surface of the first side 106 of the core structure 102. The implanted dopants 330 cause defects in the core structure 102 and alters the physical, chemical, and electrical properties of a material of the core structure 102. The dopants 330 may be selected from a group comprising gold (Au), silver (Ag), palladium (Pd), manganese (Mn), hydrogen (H), arsenic (As), nitrogen (N), and oxygen (O). In some embodiments, the dopants 330 may be at least one of gold (Au), silver (Ag), palladium (Pd), and manganese (Mn), such as one of gold (Au), silver (Ag), or manganese (Mn), such as one of gold (Au) or silver (Ag). In some embodiments, an ion may be selected as the dopants 330. In some embodiments, the dopants 330 may be selected from Group 11 of the periodic table. The implanted dopants 330 may be selected to adjust a bulk resistivity and/or a bulk conductivity of the core structure 102. For example, the implanted dopants 330 may be chosen to achieve the first bulk resistivity across the surface of the first side 106 of the core structure 102.

The implanted dopants 330 work as recombination centers by compensating for shallow impurities such as phosphorus (P) and boron (B). For example, shallow donors are compensated by deep acceptors whereas shallow acceptors are compensated by deep donors. In embodiments where the core structure 102 is annealed after the implantation process, such as later described, the implanted dopants 330, such as gold (Au), may diffuse into the core structure 102 forming substitutional gold (Au).

In some embodiments, such as described in relation to the operation 222 of the process 220 in FIG. 2B and some embodiments of the operation 244 in FIG. 2C, the implantation process may be performed to achieve a first bulk conductivity across the surface of the first side 106 of the core structure 102. In some embodiments, the first bulk conductivity may be a first bulk thermal conductivity that is at least 1 W/mK. For example, the first bulk thermal conductivity may be at least 30 W/mK, such as at least 100 W/mK, such as at least 150 W/mK. In some embodiments, annealing the core structure 102 results in a second bulk conductivity across the surface of the first side 106 of the core structure 102. In some embodiments, the bulk conductivity may be the inverse of the bulk resistivity. In some embodiments, the first bulk resistivity may be 0.1 S/m or less, such as 0.02 S/m or less, such as 0.014 S/m or less, such as 0.01 S/m or less, such as 0.0014 S/m or less. Additionally, the first bulk resistivity may be within an upper and lower limit across the surface of the first side 106, such as +/−0.1 S/m, such as +/−0.2 S/m, such as +/−0.01 S/m.

The dopants 330 may be implanted by ion beam or plasma process. In some embodiments, the implantation process comprises scanning at least the first side 106 of the core structure 102 with an ion beam. In some embodiments, the implantation process comprises a plasma immersion process. For example, the plasma immersion process may be plasma-immersion ion implantation or pulsed-plasma doping. In some embodiments, the implantation process may be a direct implant. In other embodiments, the implantation process may be a deposition followed by diffusion. In some cases, a capping layer may be used during a diffusion implant process In some embodiments, the core structure 102 may be thinned, as described in relation to FIG. 3A, to a thickness of less than about 200 μm before performing the implantation process. For example, the core structure 102 may be thinned to a thickness of about less than 170 μm, such as about less than 150 μm, such as about less than 100 μm, such as about less than 75 μm, such as less than about 50 μm.

Referring to FIGS. 2A-2C at operations 204, 224, and 246, respectively, in some embodiments, the core structure 102 is annealed. For example, the core structure 102 may be annealed after performing the implantation process. Annealing may beneficially adjust strains in the core structure 102. For example, annealing may be used to rearrange dislocations in a crystal lattice of the core structure 102 caused by the implantation process. The implanted dopants 330 may diffuse into the crystal lattice. In some embodiments, the core structure 102 may be annealed to a temperature of at least 1200° C., such as at least 900° C., such as at least 800° C., such as at least 400° C. In some embodiments, the core structure 102 may be annealed for at least 1 sec, such as for at least 30 seconds, such as for at least 1 minute, such as for at least 15 minutes, such as for at least 30 minutes, such as for at least 1 hour, such as for at least 1.5 hours, such as for at least 2 hours. Annealing the core structure 102 may result in a second bulk resistivity across the surface of the first side 106 of the core structure 102. The second bulk resistivity may be different from the first bulk resistivity. The second bulk resistivity may vary based on the annealing process, such as the temperature and a duration the core structure 102 is exposed to the temperature.

In the depicted embodiment, and in operation 242 of FIG. 2C, an oxide layer 305 is formed across the surface of the first side 106 of the core structure 102 before performing the implantation process. The oxide layer 305 may be formed by exposing the core structure 102 to an oxidation process to grow the oxide layer 305 across the surface of the first side 106. For example, the oxide layer 305 may be formed in a similar manner as the passivating layer 104 described in relation to FIG. 1. The oxide layer 305 may beneficially protect the surface of the first side 106 from the ion beam during implantation of dopants 330 and/or prevent diffusion of the dopants 330 back to the surface of the first side 106 when the core structure 102 is annealed. In some embodiments, the core structure 102 comprises the oxide layer 305 on the first and second sides 106 and 108, respectively.

Figure 3C:
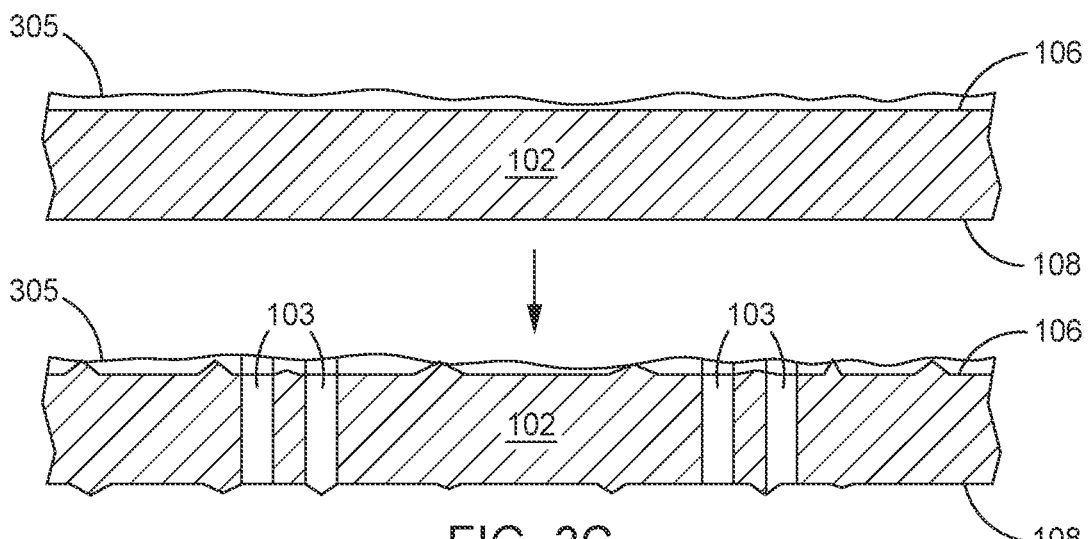

In the embodiment depicted in FIG. 3C, the core structure 102 has been implanted with the dopants 330 (FIG. 3B) and the oxide layer 305 has been damaged from the implantation process. In operations 206, 226, and 248 of FIGS. 2A-2C, respectively, a plurality of holes are formed through the damaged oxide layer 305 and in the core structure 102. The plurality of holes extend from the first side 106 of the core structure 102 to the second side 108. For example, the core structure 102 is patterned to form one or more core vias 103 therein (four core vias 103 are depicted). The core vias 103 are configured to form one or more conductive interconnections (e.g., the electrical interconnections 144 in FIG. 1) within the core structure 102 and between the first side 106 and the second side 108. In some embodiments, the core vias 103 are utilized to form direct-contact electrical interconnections through the core structure 102.

Generally, the one or more core vias 103 may be formed by laser ablation (e.g., direct laser patterning). Any suitable laser ablation system may be utilized to form the one or more core vias 103. In some examples, the laser ablation system utilizes an infrared (IR) laser source. In some examples, the laser source is a picosecond ultraviolet (UV) laser. In other examples, the laser is a femtosecond UV laser. In still other examples, the laser source is a ferntosecond green laser. The laser source of the laser ablation system generates a continuous or pulsed laser beam for patterning of the core structure 102. For example, the laser source may generate a pulsed laser beam having a frequency between 5 kHz and 500 kHz, such as between 10 kHz and about 200 kHz. In one example, the laser source is configured to deliver a pulsed laser beam at a wavelength between about 200 nm and about 1200 nm and a pulse duration between about 10 ns and about 5000 ns with an output power between about 10 Watts and about 100 Watts. The laser source is configured to form any desired pattern of features in the core structure 102, including the core vias 103.

In some embodiments, the core vias 103 may have a tapered or conical morphology, wherein a diameter at a first end thereof (e.g., at one surface of the substrate 302) is larger than a diameter at a second end thereof. Formation of tapered or conical morphologies may be accomplished by moving the laser beam of the laser source utilized during structuring in a spiraling (e.g., circular, corkscrew) motion relative to the central axis of each of the core vias 103. The laser beam may also be angled using a motion system to form tapered core vias 103. The same methods may also be utilized to form cylindrical core vias 103 having uniform diameters therethrough.

Figure 3D:
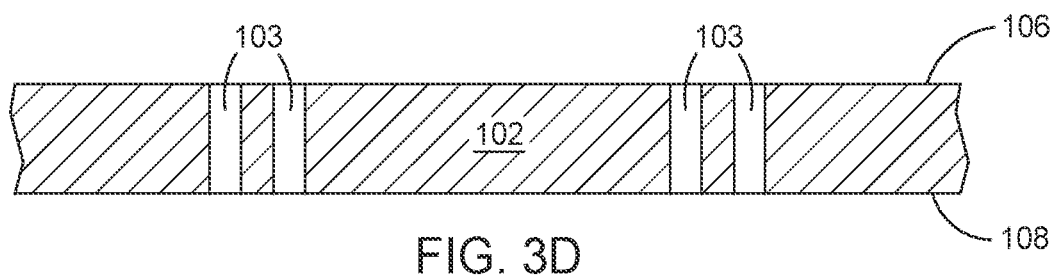

Referring to the embodiment depicted in FIG. 3D, forming a plurality of holes in the core structure 102 may cause unwanted mechanical defects in the surfaces of the core structure 102, including chipping, cracking, and/or warping. Thus, in operation 250 of FIG. 2C, after forming the core vias 103 in the core structure 102, the core structure 102 may be exposed to a second damage removal process that is substantially similar to the first damage removal process to smoothen the surfaces of the core structure 102 and remove unwanted debris. As described above, the second damage removal process includes exposing the core structure 102 to a wet or dry etch process, followed by rinsing and drying thereof. The etch process proceeds for a predetermined duration to smoothen the surfaces of the core structure 102, and particularly the surfaces exposed to laser patterning operations. In some embodiments, the etch process is utilized to remove any undesired debris remaining on the core structure 102 from the patterning process.

In some embodiments, the dopants 330 may be implanted into the core structure 102 without the oxide layer 305. In some embodiments, the plurality of holes (e.g., the core vias 103) may be formed after the oxide layer 305 is removed. For example, a damage removal process substantially similar to the first and second damage removal processes may be used to remove the oxide layer 305 and to smoothen the surface of the first side 106 of the core structure 102 and remove unwanted debris from the implantation process and provide a smooth surface on which to form the plurality of holes. In some embodiments, the first side 106 of the core structure 102 may be exposed to an implantation process after forming the plurality of holes in the core structure 102.

In some embodiments, the core structure 102 may be placed on a carrier plate (not shown) for mechanical support and stabilization during the processing operations previously described, thus preventing the core structure 102 from breaking.

Although described in relation to the first side 106, the operations described in FIGS. 3B-3D may be performed on the second side 108 of the core structure 102. For example, the second side 108 of the core structure 102 may be exposed to an implantation process to achieve the first bulk resistivity across a surface of the second side 108 of the core structure 102. The dopants 330 may be implanted into the surface of the second side 108. In some embodiments, an oxide layer (e.g., the oxide layer 305 in FIG. 3B) may be formed across the surface of the second side 108 of the core structure 102 before performing the implantation process.

Figure 3E:
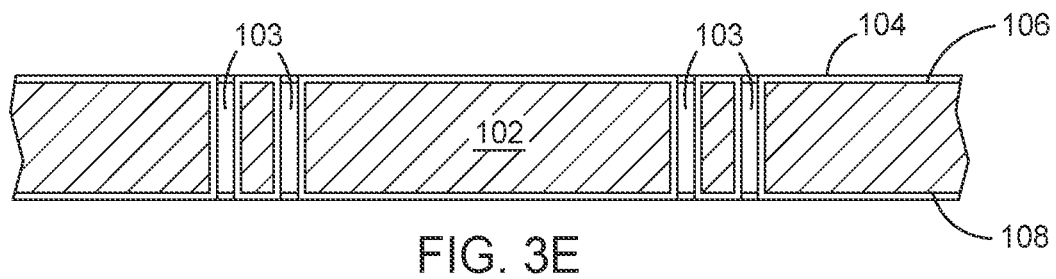

In the embodiment depicted in FIG. 3E, and in operation 254 of FIG. 2C the core structure 102 is exposed to a passivation process to grow or deposit a passivating film or layer, such as the passivating layer 104 (e.g., an oxide layer), on desired surfaces thereof (e.g., all surfaces of the core structure 102). The passivation process for forming the passivating layer 104 is discussed above with respect to FIG. 1. The passivation process may occur after the second damage removal process removes mechanical defects in the core structure 102 as discussed in relation to FIG. 3D.

Upon passivation, the core structure 102 is ready to be utilized for the formation of a core assembly, such as the semiconductor core assembly 100 (FIG. 1). For example, the core structure 102 may be embedded in a dielectric material such as the insulating layer 118 of FIG. 1.

Figure 3F:
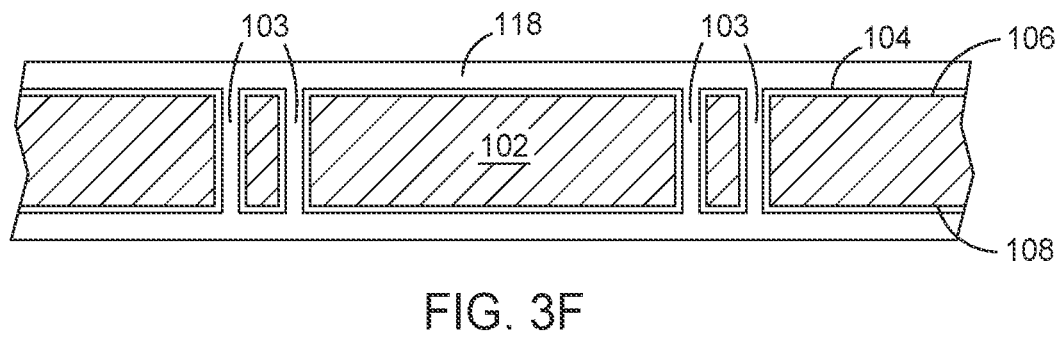

In the embodiment depicted in FIG. 3F, and in operations 208, 228, and 254 of FIGS. 2A-2C, respectively, the core structure 102 is embedded in the insulating layer 118. The insulating layer 118 may be formed from a flowable build-up material as described in relation to FIG. 1. In some embodiments, the insulating layer 118 may be formed through a lamination process. For example, a vacuum lamination process may be performed in an autoclave or other suitable device. In some embodiments, the lamination process is performed by use of a hot pressing process. In some embodiments, the lamination process is performed at a temperature of between about 80° C. and about 140° C. and for a period between about 5 seconds and about 1.5 minutes, such as between about 30 seconds and about 1 minute. In some embodiments, the lamination process includes the application of a pressure of between about 1 psig and about 50 psig while a temperature of between about 80° C. and about 140° C. is applied to core structure 102 and insulating layer 118 a for a period between about 5 seconds and about 1.5 minutes. For example, the lamination process is performed at a pressure of between about 5 psig and about 40 psig and a temperature of between about 100° C. and about 120° C. for a period between about 10 seconds and about 1 minute. For example, the lamination process is performed at a temperature of about 110° C. for a period of about 20 seconds.

In some embodiments, the core structure 102 may be a mono or single crystalline silicon wafer. In some embodiments, the monocrystalline silicon may be grown by a float zone method (referred to as float zone silicon), which may result in core structures 102 having bulk resistivities of more than 1 kOhm-cm and up to 70 kOhm-cm without implanting the dopants 330. Core structures 102 comprising float zone silicon may be used as part of a gigahertz integrated circuit. However, float zone silicon is expensive to manufacture and generally may not be used for core structures 102 greater than 200 mm in diameter due to surface tension limitations during crystal growth. In some embodiments, the monocrystalline silicon may be grown by the Czochralski method (referred to as Czochralski silicon). Czochralski silicon core structures 102 may be 200 mm or greater in diameter, such as 300 mm or greater in diameter, such as 450 mm or greater in diameter, such as about 675 mm in diameter, and may be produced at a lower cost and in higher volumes than float zone silicon core structures 102. Czochralski silicon core structures 102 may have bulk resistivities below 100 Ohm-cm before implanting with dopants 330. Such resistivities cannot be used as part of a gigahertz integrated circuit. However, the bulk resistivities of Czochralski silicon core structures 102 may be increased using the implanted dopants 330, such as in operation 202 of the process 200 in FIG. 2A and in some embodiments of the operation 244 of the process 240 in FIG. 2C. In some embodiments, such as those previously discussed, Czochralski silicon core structures 102 implanted with dopants 330 may have bulk resistivities similar to float zone silicon core structures 102, such as more than 1 kOhm-cm and up to 70 kOhm-cm. Thus, Czochralski silicon core structures 102 implanted with dopants 330 may be used as part of a gigahertz integrated structure, and may be manufactured at a fraction of the cost of float-zone silicon core structures 102.

In some embodiments, the core structure 102 may comprise glass. For example, the core structure 102 may be a glass wafer. The glass core structure 102 may comprise borosilicate glass, fused silica, and other glass-ceramic materials. In some embodiments, the glass may comprise silica. For example, the core structure 102 may comprise soda-lime glass. A core structure 102 that predominantly comprises glass may offer several advantages over a core structure 102 that predominantly comprises silicon. Glass may offer better thermal stability and increased stiffness, which beneficially minimizes warpage of the core structure 102 during processing. A glass core structure 102 may be more cost effective to manufacture than silicon. Glass core structures 102 may achieve a lower thickness than silicon. Further, a core structure 102 comprising glass that is implanted with the dopants 330, as discussed in relation to FIGS. 3A-3F, may offer bulk resistivities or conductivities similar to electronic-grade silicone at a fraction of the manufacturing cost.

Figure 4A:
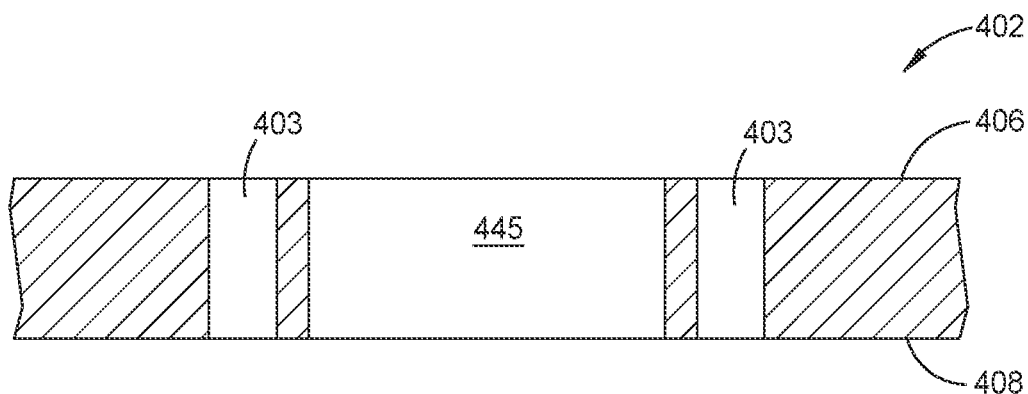
FIGS. 4A and 4B schematically illustrate a cross-sectional view of a core structure and a semiconductor core assembly having a die, respectively, according to an embodiment described herein.
Figure 4B:
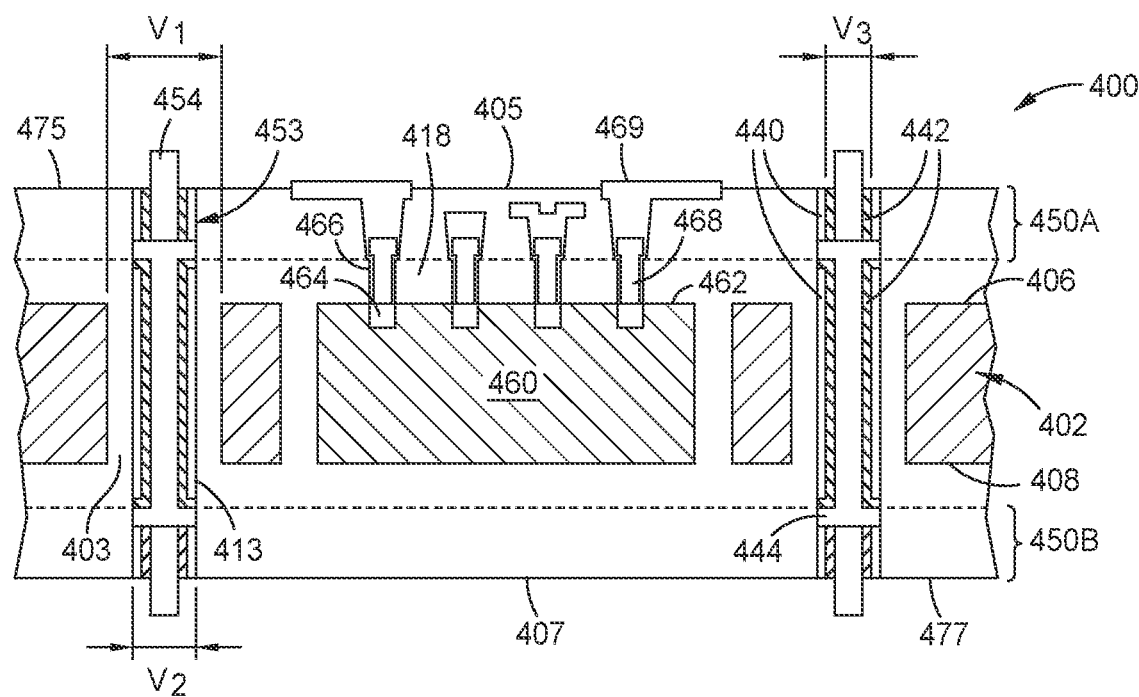

FIGS. 4A and 4B schematically illustrate a cross-sectional view of a core structure 402 and a semiconductor core assembly 400 having a die 460, respectively, according to an embodiment described herein. In particular, FIGS. 4A and 4B schematically illustrate cross-sectional views of the core structure 402 at different stages of the process 240 depicted in FIG. 2C. Therefore, FIG. 2C and FIGS. 4A and 4B are herein described together for clarity.

As shown in the embodiment in FIG. 4A, the core structure 402 may be similar to the core structure 102 discussed in relation to FIGS. 1 and 3A-3F. For example, the core structure 402 has a first side 406, a second side 408, and a plurality of holes or core vias 403, which may be formed in operation 248 of FIG. 2C. The core structure 402 further includes a cavity 445 that may be formed by the same means as the core vias 403. For example, the cavity 445 may be formed in the first side 406 of the core structure 402.

The core vias 403 are utilized to allow formation of direct contact electrical interconnections through the core structure 402 and the cavity 445 is utilized to receive and enclose (e.g., embed) a semiconductor die or device therein, such as discussed in relation to FIG. 4B. The cavity 445 may be shaped and sized to accommodate any desired devices and/or dies in any desired arrangement for 2D heterogeneous packaging integration. Although only two core vias 403 and one cavity 445 are depicted in FIG. 4A, any number and arrangement of core vias and cavities may be formed in the core structure 402. In the depicted embodiment, the core structure 402 has been exposed to an implantation process on the first side 406. In some embodiments, a second side 408 of the core structure 402 may be exposed to the implantation process.

The semiconductor core assembly 400 depicted in FIG. 4B may be similar to the semiconductor core assembly 100 discussed in relation to FIG. 1, except as otherwise noted. For example, the semiconductor core assembly 400 has a first major surface 405 and a second major surface 407. A die 460, such as a semiconductor die, is placed in the cavity 445 formed in the core structure 402 and is bound by an insulating layer 418, such as discussed in relation to operation 252 of FIG. 2C. In some embodiments, the die 460 is a multipurpose die having integrated circuits and contacts 464 formed on an active surface 462 thereof. In embodiments having multiple cavities 445, the die 460 may be placed in each cavity 445. For example, the dies 460 in the cavities 445 may be the same type of semiconductor device or die. Alternatively, each cavity 445 may house a die 460 of a different type of semiconductor devices or dies.

The semiconductor core assembly 400 further includes the core structure 402 and the insulating layer 418 formed on one or more surfaces of the core structure 402 in operation 254 of FIG. 2C. One or more through-assembly vias 413 are formed through the insulating layer 418 where the insulating layer 418 extends into the core vias 403. The through-assembly vias 413 provide channels through which one or more electrical interconnections 444 are formed. In operation 256 of FIG. 2C, contact holes 466 are drilled through the insulating layer 418 to expose one or more contacts 464 formed on the active surface 462 of the embedded die 460. The contact holes 466 may be drilled through the insulating layer 418 by laser ablation, leaving all external surfaces of the die 460 covered and surrounded by the insulating layer 418 and exposing the contacts 464. Interconnections 468 may be formed through the contact holes 466 and coupled to the contacts 464 on the active surface 462.

The semiconductor core assembly 400 further includes one or more redistribution layers 450 formed on a first side 475 and/or a second side 477 of the semiconductor core assembly 400. For example, a first redistribution layer 450A may be formed on the first side 406 of the core structure 402 and a second redistribution layer 450B may be formed on the second side 408 of the core structure 402 in operations 258 and 260 of FIG. 2C. The redistribution layers 450 have one or more conductive contacts formed thereon. In some embodiments, the redistribution layers 450 are formed of substantially the same materials as the insulating layer 418 (e.g., polymer-based dielectric materials), and thus forms an extension thereof. In other embodiments, the redistribution layers 450 are formed of a different material than the insulating layer 418. For example, the redistribution layers 450 may be formed of a photodefinable polyimide material, a non-photosensitive polyimide, polybenzoxazole (PBO), benzocyclobutene (BCB), silicon dioxide, and/or silicon nitride. In another example, the redistribution layer 450 is formed from a different inorganic dielectric material than the insulating layer 418. In some embodiments, the redistribution layers 450 have a thickness between about 5 µm and about 50 µm, such as a thickness between about 10 µm and about 40 µm. For example, the redistribution layer 450 has a thickness between about 20 µm and about 30 µm, such as about 25 µm. In some embodiments, the first redistribution layer 450A may have a different thickness than the second redistribution layer 450B.

The redistribution layers 450 may include one or more redistribution connections 454 formed through redistribution vias 453 for relocating and electronically coupling contact points of the electrical interconnections 444 to desired locations on the surfaces of the semiconductor core assembly 400, such as the major surfaces 405 and 407. The first redistribution layer 450A may further include redistribution connections 469 for similarly relocating contact points of the electrical interconnections 468. In some embodiments, the redistribution layers 450 may further include one or more external electrical connections (not shown) formed on the major surfaces 405 and 407, such as a ball grid array or solder balls. The electrical connections may connect to the redistribution connections 454 and the 469. Generally, the redistribution vias 453 and the redistribution connections 454 have substantially similar or smaller lateral dimensions relative to the through-assembly vias 413 and the electrical interconnections 444, respectively. For example, the redistribution vias 453 have a diameter $V_3$ between about 2 µm and about 50 µm, such as a diameter $V_3$ between about 10 µm and about 40 µm, such as a diameter $V_3$ between about 20 µm and about 30 µm. Furthermore, the redistribution layers 450 may include an adhesion layer 440 and a seed layer 442 formed on surfaces adjacent to the redistribution connections 454, including sidewalls of the redistribution vias 453. A diameter $V_1$ of the core vias 403 and a diameter $V_2$ of the through-assembly vias 413 are similar to the diameters $V_1$ and $V_2$ described in relation to FIG. 1. In some embodiments, the semiconductor core assembly 400 may be used in a semiconductor device assembly as part of an integrated circuit chip.

As used herein, the term "about" may refer to a +/−10% variation from the nominal value. It is to be understood that such a variation can be included in any value provided herein.

Embodiments of the present disclosure have been described above with reference to specific embodiments. Persons skilled in the art, however, will understand that various modifications and changes may be made thereto without departing from the broader spirit and scope of the invention as set forth in the appended claims. The foregoing description and drawings are, accordingly, to be regarded in an illustrative rather than a restrictive sense.

What is claimed is:

1. A method of forming a semiconductor device package, comprising:
    exposing a first side of a core structure to an implantation process to achieve a first bulk resistivity across a surface of the first side of the core structure, wherein:
        the core structure comprises silicon,
        the implantation process comprises implanting dopants into the surface of the first side, and
        the dopants are selected from a group comprising gold (Au), silver (Ag), palladium (Pd), manganese (Mn), hydrogen (H), arsenic (As), nitrogen (N), and oxygen (O);
    exposing a second side of the core structure to the implantation process to achieve the first bulk resistivity across a surface of the second side of the core structure, wherein the implantation process comprises implanting the dopants into the surface of the second side;
    annealing the core structure after performing the implantation process;
    forming a plurality of holes in the core structure, wherein the plurality of holes extend from the first side to the second side of the core structure opposite the first side, and are positioned to allow formation of one or more conductive interconnections within the semiconductor device package between the first side and the second side; and
    embedding the core structure in a dielectric material.

2. The method of claim 1, further comprising forming an oxide layer across the surface of the first side of the core structure before performing the implantation process.

3. The method of claim 1, further comprising forming a cavity in the core structure, wherein the cavity is formed in the first side of the core structure.

4. The method of claim 3, wherein embedding the core structure in a dielectric material comprises:
    forming a first redistribution layer on the first side of the core structure;
    disposing a die in the cavity of the core structure; and
    forming a second redistribution layer on the second side of the core structure, wherein the first redistribution layer and the second redistribution layer each have one or more conductive contacts formed thereon.

5. The method of claim 1, wherein the first bulk resistivity is at least 1 kOhm-cm.

6. The method of claim 1, wherein the implantation process comprises scanning at least the first side of the core structure with an ion beam.

7. The method of claim 1, wherein the implantation process comprises a plasma immersion process.

8. The method of claim 1, further comprising thinning the core structure to a thickness of less than about 200 μm before performing the implantation process.

9. The method of claim 1, wherein the core structure comprises a mono or single crystalline silicon substrate.

10. The method of claim 1, wherein the core structure further comprises glass.

11. The method of claim 1, wherein the dopants are at least one of gold (Au), silver (Ag), palladium (Pd), or manganese (Mn).

12. The method of claim 1, wherein annealing the core structure results in a second bulk resistivity across the surface of the first side of the core structure.

13. The method of claim 1, wherein exposing the first side of the core structure to the implantation process occurs after forming the plurality of holes in the core structure.

14. A method of forming a semiconductor device package, comprising:
    exposing a first side of a core structure to an implantation process to achieve a first bulk resistivity across a surface of the first side of the core structure, wherein:
        the core structure comprises silicon,
        the implantation process comprises implanting dopants into the surface of the first side, and
        the dopants are selected from a group comprising gold (Au), silver (Ag), palladium (Pd), manganese (Mn), hydrogen (H), arsenic (As), nitrogen (N), and oxygen (O);
    annealing the core structure after performing the implantation process;
    forming a plurality of holes in the core structure, wherein the plurality of holes extend from the first side to a second side of the core structure opposite the first side, and are positioned to allow formation of one or more conductive interconnections within the semiconductor device package between the first side and the second side; and
    embedding the core structure in a dielectric material, wherein exposing the first side of the core structure to the implantation process occurs after forming the plurality of holes in the core structure.

15. The method of claim 14, further comprising forming an oxide layer across the surface of the first side of the core structure before performing the implantation process.

16. The method of claim 14, further comprising forming a cavity in the core structure, wherein the cavity is formed in the first side of the core structure.

17. A method of forming a semiconductor device package, comprising:
    exposing a first side of a core structure to an implantation process to achieve a first bulk resistivity across a surface of the first side of the core structure, wherein:
        the core structure comprises silicon and glass,
        the implantation process comprises implanting dopants into the surface of the first side, and
        the dopants are selected from a group comprising gold (Au), silver (Ag), palladium (Pd), manganese (Mn), hydrogen (H), arsenic (As), nitrogen (N), and oxygen (O);
    annealing the core structure after performing the implantation process;
    forming a plurality of holes in the core structure, wherein the plurality of holes extend from the first side to a second side of the core structure opposite the first side, and are positioned to allow formation of one or more conductive interconnections within the semiconductor device package between the first side and the second side; and
    embedding the core structure in a dielectric material.

18. The method of claim 17, further comprising forming an oxide layer across the surface of the first side of the core structure before performing the implantation process.

19. The method of claim 17, further comprising forming a cavity in the core structure, wherein the cavity is formed in the first side of the core structure.

* * * * *